(12) United States Patent
Lee et al.

(10) Patent No.: US 7,974,072 B2
(45) Date of Patent: Jul. 5, 2011

(54) MULTILAYER CAPACITOR ARRAY

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 519 days.

(21) Appl. No.: 11/979,875

(22) Filed: Nov. 9, 2007

(65) Prior Publication Data
US 2008/0158773 A1 Jul. 3, 2008

(30) Foreign Application Priority Data

Dec. 29, 2006 (KR) .................. 10-2006-0137587

(51) Int. Cl.
*H01G 4/005* (2006.01)
*H01G 4/06* (2006.01)
*H01G 4/02* (2006.01)

(52) U.S. Cl. .................. 361/303; 361/311; 361/329

(58) Field of Classification Search .......... 361/303–305, 361/306.1, 306.3, 309, 328–329
See application file for complete search history.

(56) References Cited

U.S. PATENT DOCUMENTS

| 5,880,925 | A | 3/1999 | DuPre et al. |
| 6,441,459 | B1 | 8/2002 | Togashi et al. |
| 6,515,842 | B1 * | 2/2003 | Hayworth et al. ............ 361/303 |
| 7,542,264 | B2 * | 6/2009 | Oshima ..................... 361/306.3 |

FOREIGN PATENT DOCUMENTS

| JP | 59034621 A | * | 2/1984 |
| JP | 2000331879 A | * | 11/2000 |

* cited by examiner

*Primary Examiner* — Eric Thomas
(74) *Attorney, Agent, or Firm* — McDermott Will & Emery LLP

(57) ABSTRACT

A multilayer capacitor array having a plurality of multilayer capacitor devices formed in a single multilayer structure, the multilayer capacitor array including: a capacitor body formed by depositing a plurality of dielectric layers and having first and second side surfaces opposite to each other; a plurality of first polarity internal electrodes and second polarity internal electrodes, disposed oppositely to each other in the capacitor body, interposing the dielectric layer there between, and formed of a single electrode plate comprising a single lead, respectively; and a plurality of first polarity external electrodes and second polarity external electrodes, formed on the first side surface and second side surface, respectively, and connected to a correspondent polarity internal electrode via the lead, the first polarity external electrode formed on the first side surface and the second polarity external electrode formed on the second side surface, wherein the numbers of the first polarity external electrodes and the second polarity external electrodes are two or more, respectively, and are identical to each other, and a total number of the multilayer capacitor devices in the multilayer capacitor array is identical to the number of the first polarity external electrodes.

17 Claims, 11 Drawing Sheets

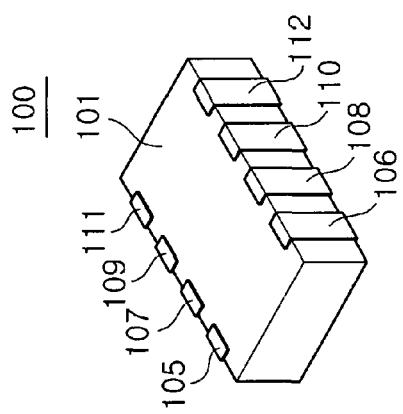
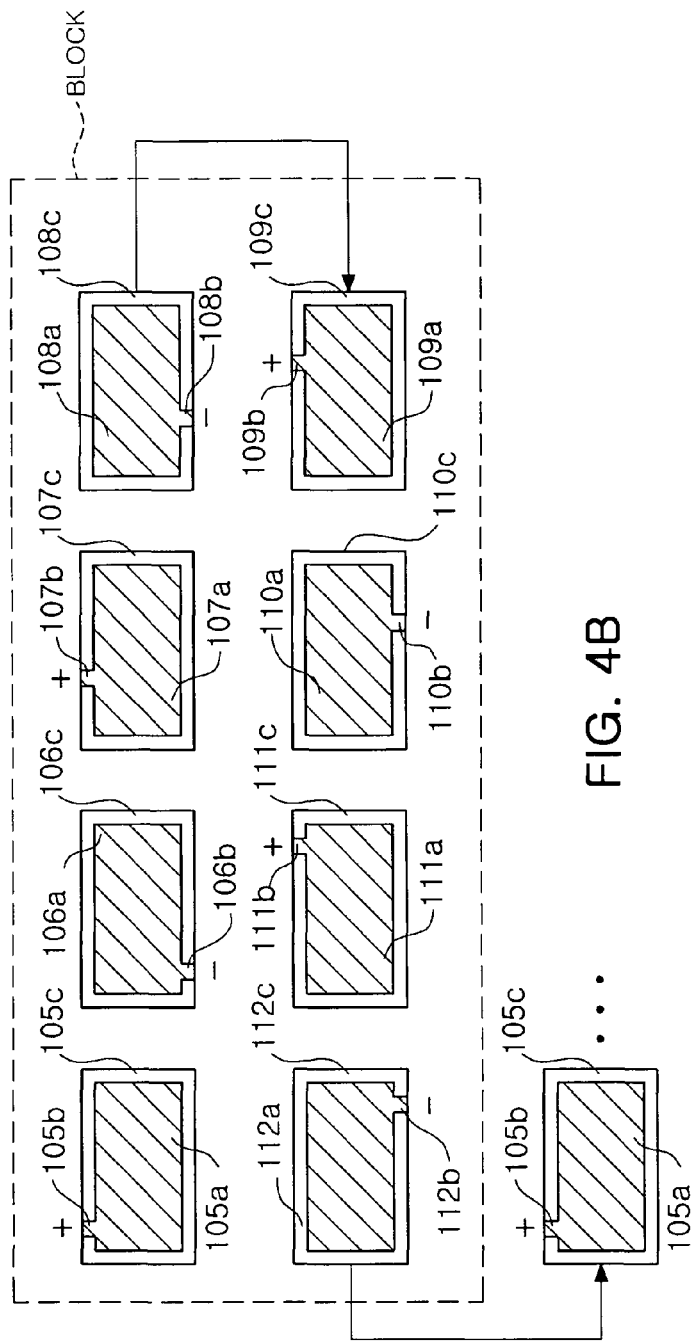

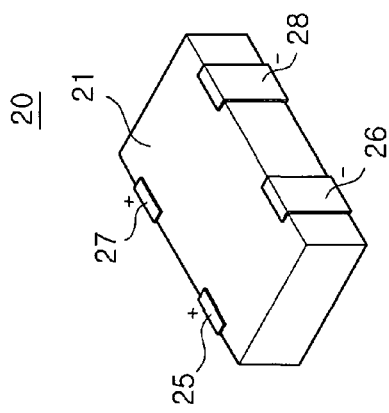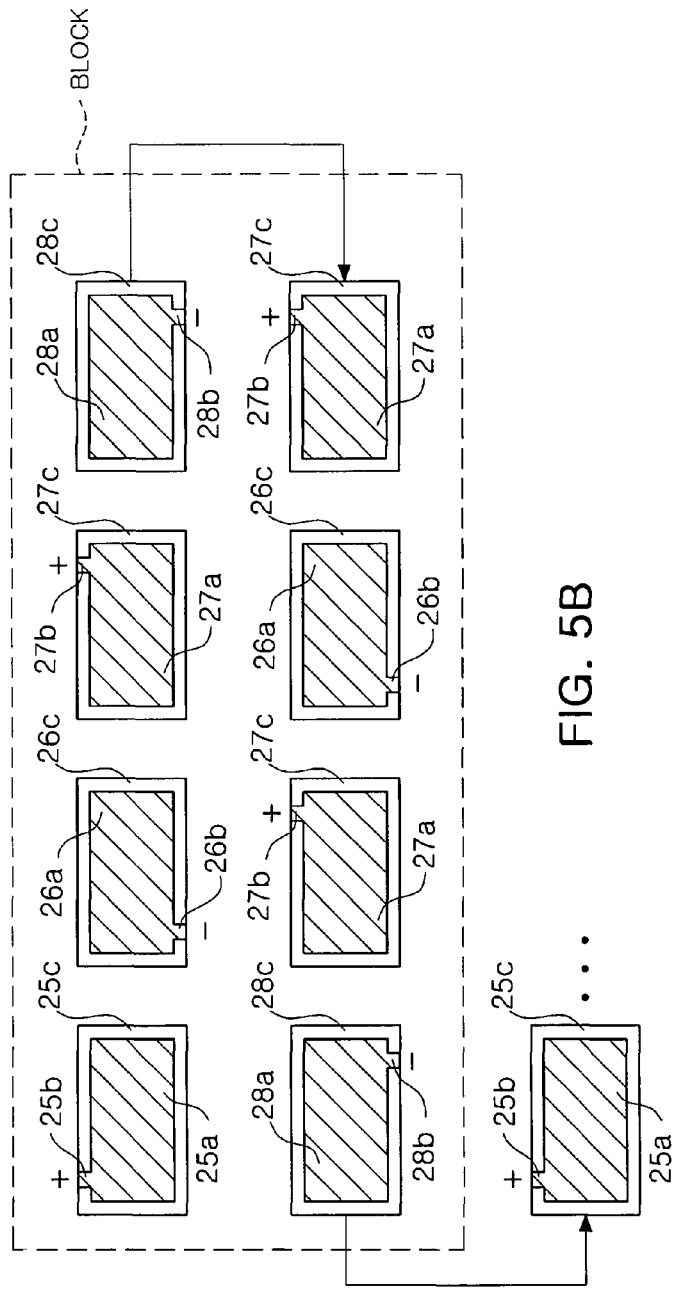

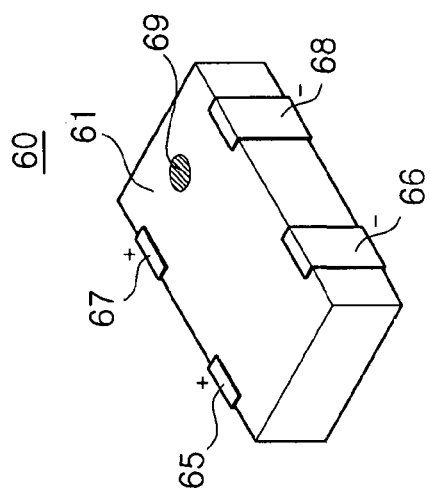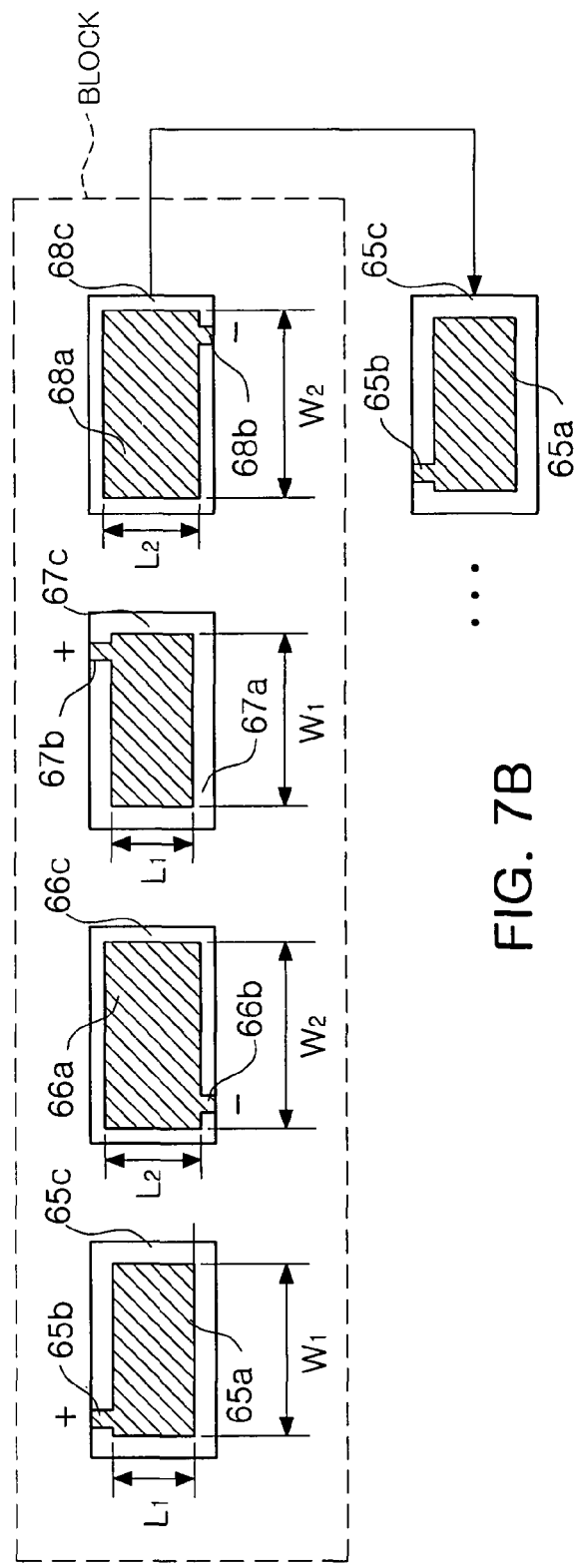

MULTILAYER CAPACITOR ARRAY

CROSS-REFERENCE TO RELATED APPLICATIONS

This application claims the priority of Korean Patent Application No. 2006-137587 filed on Dec. 29, 2006, in the Korean Intellectual Property Office, the disclosure of which is incorporated herein by reference.

BACKGROUND OF THE INVENTION

1. Field of the Invention

The present invention relates to a multilayer capacitor array, and more particularly, to a multilayer capacitor array capable of embodying high capacitance, preventing crosstalk between capacitor devices and delamination between layers, and having low equivalent series inductance (ESL) characteristics.

2. Description of the Related Art

Multilayer capacitor arrays are very useful to reduce a mounting area for a plurality of multilayer capacitor devices. To increase a mounting density, there are provided various multilayer capacitor arrays integrating a plurality of multilayer capacitor devices into one chip. To reduce a mounting area, multilayer capacitor devices are provided in a capacitor array, one chip, as possible. FIG. 1A is a perspective view illustrating a conventional multilayer capacitor array 1, and FIG. 1B is a top view illustrating a conventional structure of internal electrodes.

Referring to FIG. 1, the multilayer capacitor array 1 includes a capacitor body 2 and external electrodes 5, 6, 7, and 8 formed on sides of the capacitor body 2. In the capacitor body 2, a dielectric layer 3 on which electrode plates 5a and 7a, separated from each other, are printed and a dielectric layer 4 on which electrode plates 6a and 8a, separated from each other, are printed are alternately deposited. The respective electrode plates 5a to 8a include leads or drawn portions 5b to 8b connected to correspondent external electrode 5 to 8.

In the capacitor array 1, two multilayer capacitor devices independent from each other are formed. One of the capacitor devices, a first multilayer capacitor device, is formed by alternately arranging the electrode plates 5a and 6a of different polarities. Another of the capacitor devices, a second multilayer capacitor device, is formed by alternately arranging the electrode plates 7a and 8a of different polarities. A plurality of the electrode plates 5a and 6a form the first capacitor device, and a plurality of the electrode plates 7a and 8a form the second capacitor device.

FIG. 2A is a circuit diagram illustrating an example of the multilayer capacitor array of FIG. 1A, and FIG. 2B is an equivalent circuit diagram illustrating the example of FIG. 2A. For example, the capacitor array 1 may be used as an electromagnetic interference (EMI) filter removing noise of signal lines S1 and S2 different from each other or a decoupling capacitor connected to source lines P1 and P2 different from each other.

For example, the external electrodes 5 and 7 may be connected the signal lines S1 and S2 as (+) terminals, respectively, and the external electrodes 6 and 8 may be connected to a ground as (−) terminals. The respective capacitor devices in the capacitor array 1 have not only capacitance but also parasitic inductance and resistance. Accordingly, as shown in FIG. 2B, the respective capacitor devices in the capacitor array 1 may be shown as capacitances $C_1$ and $C_2$, inductances $L_1$ and $L_2$, and resistances $R_1$ and $R_2$ connected in series. The inductances $L_1$ and $L_2$ and resistances $R_1$ and $R_2$ may be regarded as equivalent serial inductances (ESLS) and equivalent serial resistances (ESRs) of the respective capacitor devices.

As described above, connecting respective capacitor devices in a capacitor array to different signal lines S1 and S2, two EMI filter may be embodied by one chip. Also, the capacitor array 1 may be used as decoupling capacitors of a power circuit, connected to different lines P1 and P2 and corresponding to the respective lines P1 and P2.

When using the capacitor array 1, a mounting area may be more reduced than a case of using a plurality of capacitor chips. However, using an internal electrode divided in the same plane, for example, (+) electrode divided into 5a and 7a, flaking between layers, that is, delamination may occur. Also, when dividing the internal electrode in the same plane, due to a gap that is a dielectric material portion between electrode plates in the same plane, substantial decrease of an electrode area is caused, thereby generating a considerable capacitance loss.

In addition, in a situation where a demand for a capacitor with a low ESL in a high frequency circuit is currently increased, it is difficult to obtain an ESL low enough by the capacitor array 1. Furthermore, as shown in FIG. 2C, an electromagnetic interference phenomenon due to stray capacitance may easily occur between the two electrode plates 5a and 7a disposed in a line in the same plane, thereby generating crosstalk between two capacitor devices disposed in series.

SUMMARY OF THE INVENTION

An aspect of the present invention provides a multilayer capacitor array capable of providing high capacitance, including a large number of multilayer capacitor devices formed in a single multilayer body, preventing delamination and crosstalk phenomena between capacitor devices, and having low ESL characteristics.

According to an aspect of the present invention, there is provided a multilayer capacitor array having a plurality of multilayer capacitor devices formed in a single multilayer structure, the multilayer capacitor array including: a capacitor body formed by depositing a plurality of dielectric layers and having first and second side surfaces opposite to each other; a plurality of first polarity internal electrodes and second polarity internal electrodes, disposed oppositely to each other in the capacitor body, interposing the dielectric layer therebetween, and formed of a single electrode plate comprising a single lead, respectively; and a plurality of first polarity external electrodes and second polarity external electrodes, formed on the first side surface and second side surface, respectively, and connected to a correspondent polarity internal electrode via the lead, the first polarity external electrode formed on the first side surface and the second polarity external electrode formed on the second side surface, wherein the numbers of the first polarity external electrodes and the second polarity external electrodes are two or more, respectively, and are identical to each other, and a total number of the multilayer capacitor devices in the multilayer capacitor array is identical to the number of the first polarity external electrodes.

Four or more internal electrodes sequentially disposed in a deposition direction may form a single block, and the block may be repeatedly deposited.

The multilayer capacitor devices formed in the multilayer capacitor array may have a capacitance identical to each other. On the other hand, two or more multilayer capacitor devices of the multilayer capacitor devices formed in the multilayer capacitor array may have a different capacitance. Particularly, the number of internal electrodes connected to the first polarity external electrode in a first location may be different from the number of internal electrodes connected to the first polarity external electrode in a second location.

The multilayer capacitor array may be a four-terminal capacitor. In this case, first and third external electrodes of a first polarity may be disposed on the first side surface, and second and fourth external electrodes of a second polarity may be disposed on the second side surface to be opposite to the first and third external electrodes.

In the four-terminal capacitor array, four internal electrodes sequentially disposed in a deposition direction may form a single block, and the block may be repeatedly deposited, and leads of the four internal electrodes forming block may be drawn to positions without overlapping each other in the deposition direction and connected to external electrodes in different locations, respectively. The first to fourth internal electrodes may be sequentially disposed in a different direction.

The block may have first to fourth internal electrodes connected to the first to fourth external electrodes via the leads, respectively, and the first, second, third, and fourth internal electrodes may be sequentially disposed in the block.

On the other hand, in the four-terminal capacitor array, eight internal electrodes sequentially disposed in a deposition direction may form a single block, and the single block may be repeatedly deposited. In this case, the block may include first to fourth internal electrodes connected to the first to fourth external electrodes via the leads, respectively, and the first to fourth internal electrodes may be consecutively disposed in the block in order of first, second, third, fourth, third, second, third, and fourth internal electrodes. The first to fourth internal electrodes may be sequentially disposed in a different direction.

The multilayer capacitor array may be an eight-terminal capacitor. In this case, first, third, fifth, and seventh external electrodes of a first polarity may be disposed on the first side surface, and second, fourth, sixth, and eighth external electrodes of a second polarity may be disposed on the second side surface to be opposite to the first, third, fifth, and seventh external electrodes, respectively.

In the eight-terminal capacitor array, eight internal electrodes sequentially disposed in a deposition direction may form a single block, and the block may be repeatedly deposited. In this case, leads of the eight internal electrodes forming block may be drawn to positions without overlapping each other in the deposition direction and connected to external electrodes in different locations, respectively.

The block may include first to fourth internal electrodes connected to the first to eighth external electrodes via the leads, respectively, and the first, second, third, fourth, fifth, sixth, seventh, and eighth internal electrodes may be sequentially disposed in the block. The first to eighth internal electrodes may be sequentially disposed in a different direction.

On the other hand, in the eight-terminal capacitor array, twelve internal electrodes sequentially disposed in a deposition direction may form a single block, and the single block may be repeatedly deposited. In this case, the block may include first to eighth internal electrodes connected to the first to eighth external electrodes via the leads, respectively, and the first to eighth internal electrodes may be consecutively disposed in the block in order of first, second, third, fourth, third, second, third, fourth, fifth, sixth, seventh, eighth, seventh, sixth, seventh, and eighth internal electrodes. The first to eighth internal electrodes may be sequentially disposed in a different direction.

A width and a length of a main portion of the second polarity internal electrode may be larger than those of a main portion of the first polarity internal electrode. A mark for distinguishing a polarity of an external electrode may be on an external surface of the capacitor body.

The main portions of the respective second polarity internal electrodes may have larger width and length than one or more of the main portions of the first polarity internal electrodes adjacently disposed thereto.

One or more of the first polarity external electrodes may be connected to one of different signal lines whose number is a total number of the first polarity external electrodes and a power source line, and the second polarity external electrode may be connected to a ground.

BRIEF DESCRIPTION OF THE DRAWINGS

The above and other aspects, features and other advantages of the present invention will be more clearly understood from the following detailed description taken in conjunction with the accompanying drawings, in which:

FIGS. 3A through 7A are perspective views illustrating multilayer capacitor arrays according to various embodiments of the present invention, and FIGS. 3B through 7B are top views illustrating structures of internal electrodes of the multilayer capacitor arrays of FIGS. 3A through 7A, respectively;

DETAILED DESCRIPTION OF THE PREFERRED EMBODIMENT

Figure 1A:
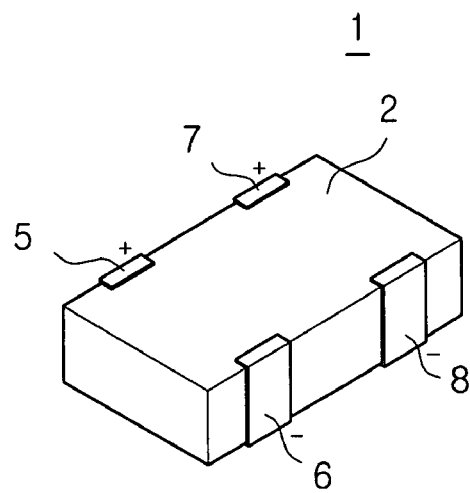
FIG. 1A is a perspective view illustrating a conventional multilayer capacitor array.

The embodiments of the present invention will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 3A:
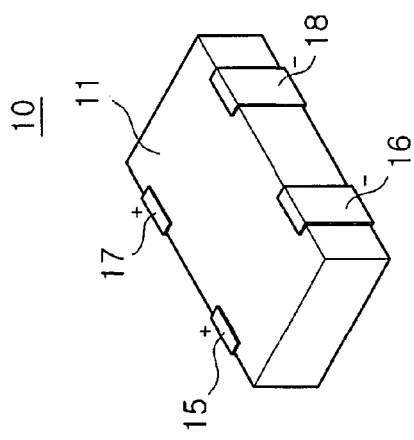
Figure 3B:
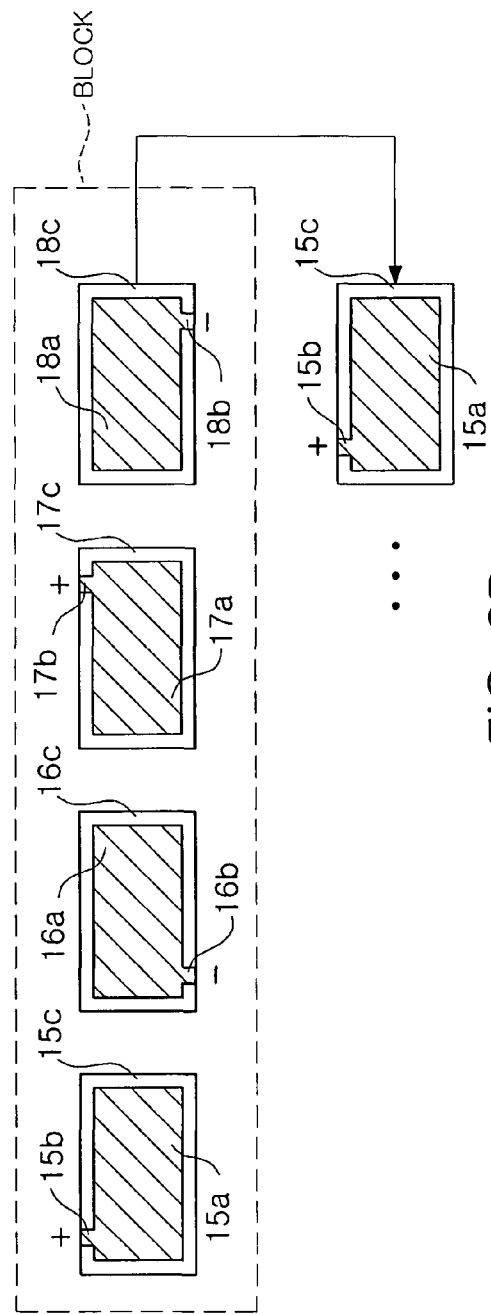

FIG. 3A is a perspective view illustrating a multilayer capacitor array 10 according to an embodiment of the present invention, and FIG. 3B is a top view illustrating an internal electrode structure. Referring to FIGS. 3A and 3B, the multilayer capacitor array 10 includes a capacitor body 11 formed by depositing dielectric layers 15c to 18c and four external electrodes 15, 16, 17, and 18 formed on side surfaces of the capacitor body 11, opposite to each other. The external electrodes 15 to 18 include two external electrodes 15 and 17 of a first polarity, for example, (+) polarity, formed on one side surface and two external electrodes 16 and 18 of a second polarity, for example, (−) polarity, formed on another side surface. The capacitor array 10 corresponds to a four-terminal array and is a two-capacitor in which two multilayer capacitor devices are provided in a single multilayer structure (a capacitor array of four-terminal & two-capacitor).

Referring to FIGS. 3A and 3B, the dielectric layers 15c to 18c including internal electrodes 15a to 18a formed therein are deposited in the direction of height of the capacitor array 10. Accordingly, in the capacitor body 11, the two adjacent internal electrodes (15a and 16a), (16a and 17a), (17a and 18a), (18a and 15a) are disposed to be opposite to each other, interposing the dielectric layers 15c to 18c therebetween, respectively. To provide electrostatic capacitance, the internal electrodes 15a and 17a of the first polarity such as (+) polarity and the internal electrodes 16a and 18a of the second polarity such as (−) polarity are alternately disposed.

Figure 1B:
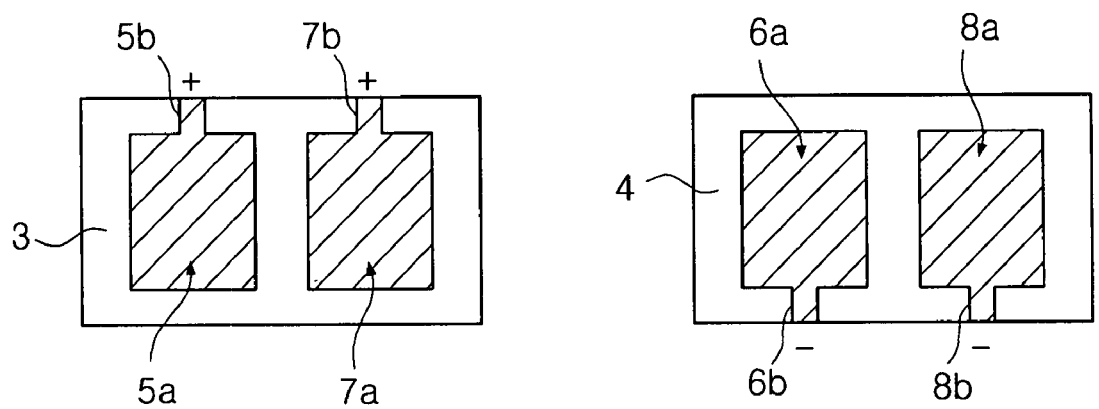
FIG. 1B is a top view illustrating a conventional structure of internal electrodes.

The respective internal electrodes 15a to 18a include only one of leads 15b to 18b and are formed of a single electrode plate. That is, the respective internal electrodes are not divided in the same plane and are formed of a single electrode pattern (compare with FIG. 1B). The internal electrodes 15a to 18a are connected to the external electrodes 15 to 18 of a correspondent polarity via the leads 15b to 18b, respectively.

As shown in FIG. 3B, the four internal electrodes 15a to 18a form one block (shown as a dotted line) as a periodical multilayer structure, which is repeatedly deposited in a deposition direction. The four internal electrodes 15a to 18a are drawn to locations without overlapping with each other in the deposition direction and connected to the external electrodes 15 to 18 in different locations, respectively. In FIG. 3B, the internal electrodes 15a, 16a, 17a, and 18a are sequentially disposed. However, the deposition order is not limited thereto. For example, in the block, the four internal electrodes may be disposed in order of 15a, 18a, 17a, and 16a.

As shown in FIG. 3B, since the internal electrodes 15a and 17a of the first polarity are connected to the external electrodes 15 and 17 of the first polarity in locations different from each other via only one lead, respectively, the capacitor array 10 totally provides two multilayer capacitor devices. That is, a multilayer device, a first capacitor device, including the internal electrode 15a connected to the first polarity external electrode 15 and a multilayer device, a second capacitor device, including the internal electrode 17a connected to the first polarity external electrode 17 in a different location are provided in the capacitor array 10.

In detail, totally, two multilayer capacitor devices are formed in the capacitor array 10. One of them, the first multilayer capacitor device has a repeated multilayer structure of (18a−/15a+/16a−), such as (18a−/15a+/16a−), (18a−/15a+/16a−), . . . , and (18a−/15a+/16a−). Accordingly, the first multilayer capacitor device employs the external electrode 15 as (+) terminal and employs the external electrodes 16 and 18 as (−) terminal. The second multilayer capacitor device has a repeated multilayer structure of (16a−/17a+/18a+), such as (16a−/17a+/18a+), (16a−/17a+/18a+), . . . , and (16a−/17a+/18a+). Accordingly, the second multilayer capacitor device employs the external electrode 17 as a (+) terminal and employs the external electrodes 16 and 18 as (−) terminals.

The first polarity external electrodes 15 and 17 of the respective capacitor devices in the capacitor array 10 are connected to one of mutually different signal lines and power source and the second external electrodes 16 and 18 are connected to a ground, thereby allowing the capacitor array 10 of a single chip structure to operate as two EMI filters or two decoupling capacitors. AS described above, the number of multilayer capacitor devices provided in an array is identical to the number, 2, of first polarity external electrodes.

According to the present embodiment, an internal electrode is not divided in the same plane and is provided as a single electrode plate. Accordingly, a delamination phenomenon occurring when dividing the internal electrode in the same plane or capacitance reduction (reduction of an electrode plate area) due to the division may be prevented. Also, comparing with a general capacitor array having an internal electrode structure divided in the same plane (refer to FIG. 1B), the width of the internal electrode may be increased, thereby obtaining a lower ESL and ESR. (the width of a current path in the internal electrode becomes broader).

Additionally, since the external electrodes are divided for each polarity and disposed on both side surfaces, in which (+) external electrode is disposed on a first side surface and (−) external electrode is disposed on a second side surface, a layout for a conductive path of a circuit board to connect to the capacitor array 10 is easily formed.

In addition, since the internal electrode 16a of the second polarity is disposed between the internal electrodes 15a and 17a of the first polarity adjacent to each other in the deposition direction, a crosstalk between capacitor devices (a crosstalk between signal lines or power source lines) may be reduced by connecting the internal electrode 16a of the second polarity to the ground. A crosstalk reduction effect will be described with reference to FIGS. 8A and 8B as follows.

Figure 8A:
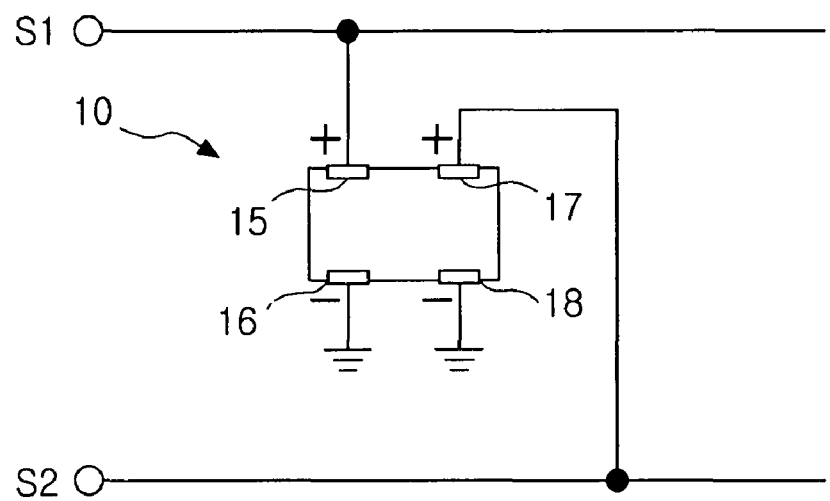
FIG. 8A is a circuit diagrams illustrating examples of the multilayer capacitor array of FIG. 3.
Figure 8B:
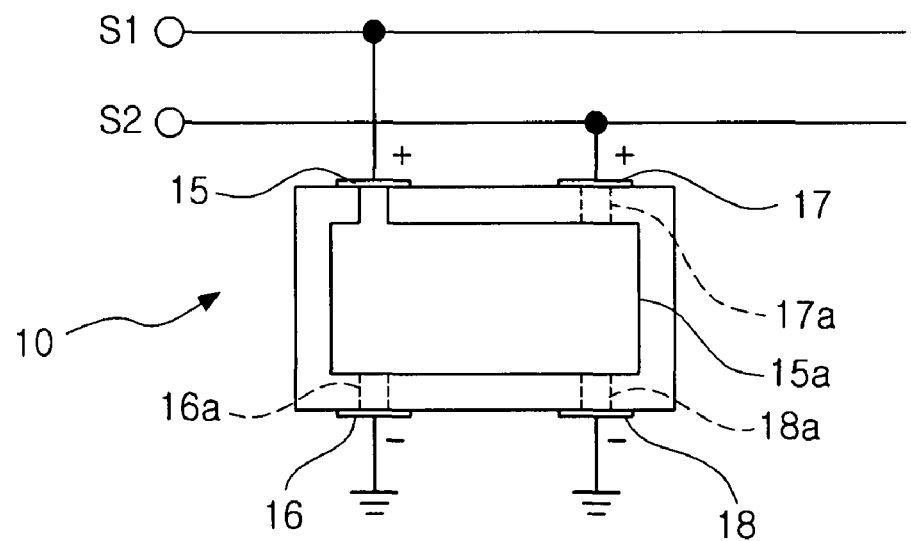
FIG. 8B is detailed view illustrating a crosstalk reduction effect.

FIG. 8A is a circuit diagrams illustrating examples of the multilayer capacitor array 10, and FIG. 8B is detailed view illustrating a crosstalk reduction effect. As shown in FIG. 8A, the multilayer capacitor array 10 may be used as an EMI filter array to be connected to two signal lines S1 and S2 to reduce noise of the respective signal lines. That is, the (+) external electrodes 15 and 17 are connected to the signal lines S1 and S2, respectively, and the (−) external electrodes 16 and 18 are connected to the ground. In this case, a first multilayer capacitor device formed by a plurality of the (+) internal electrodes 15a and (−) internal electrodes 16a and 18a is used as an EMI filter for the signal line S1, and a second multilayer capacitor device formed by a plurality of the (+) internal electrodes 17a and (−) internal electrodes 16a and 18a is used as an EMI filter for the signal line S2.

Figure 2A:
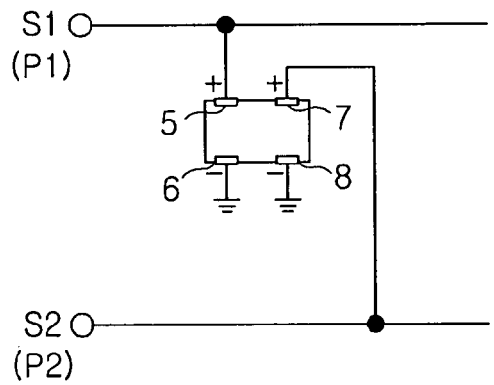
FIG. 2A is a circuit diagram illustrating an example of the multilayer capacitor array of FIG. 1A.
Figure 2B:
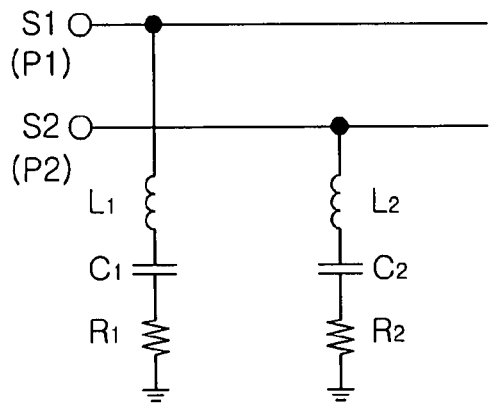
FIG. 2B is an equivalent circuit diagram illustrating the example of FIG. 2A.
Figure 2C:
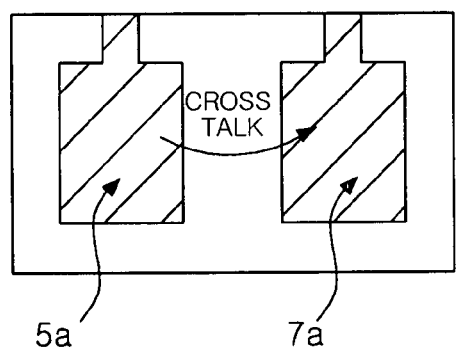
FIG. 2C is a top view illustrating a crosstalk occurring in the example of FIG. 1A.

As shown in FIG. 8B, since the (+) internal electrode 15a, the (−) internal electrode 16a, and the (+) internal electrode 17a are sequentially disposed, the two (+) internal electrodes 15a and 17a are shielded by a ground electrode inserted therebetween, that is, the (−) internal electrode 16a. Also, since the (+) internal electrode 17a, the (−) internal electrode 18a, and (+) internal electrode 15a are sequentially disposed, the two (+) internal electrodes 17a and 15a are shielded by a ground electrode inserted therebetween, that is, the (−) internal electrode 18a. Accordingly, different from a conventional capacitor array having internal electrodes divided in the same plane (refer to FIGS. 1 and 2), a crosstalk between capacitor devices in an array is prevented.

FIG. 4A is a perspective view illustrating a multilayer capacitor array 100 according to another embodiment of the present invention, and FIG. 4B is a top view illustrating an internal electrode structure. The multilayer capacitor array 100 corresponds to an eight-terminal capacitor array.

Referring to FIGS. 4A and 4B, four first polarity external electrodes 105, 107, 109, and 111 are disposed on a first side surface of a capacitor body 101, and four second polarity external electrodes 106, 108, 110, and 112 are disposed on a second side surface opposite to the first side surface. Respective internal electrodes 105a to 112a are formed of a single electrode plate having only one lead (an internal electrode not divided in the same plane). The respective internal electrodes 105a to 112a are connected to the external electrodes 105 to 112 via the leads, and the polarity of one of the internal electrodes is defined by the polarity of a corresponding external electrode connected thereto. Accordingly, the internal electrodes 105a, 107a, 109a, and 111a have a first polarity, and the internal electrodes 106a, 108a, 110a, and 112a have a second polarity.

As shown in FIG. 4B, the eight internal electrodes 105a to 112a sequentially disposed in the deposition direction form one block, which is repeatedly deposited. Leads of the eight internal electrodes 105a to 112a forming the block are drawn to positions without overlapping with each other in the deposition direction and are connected to the external electrodes 105 to 112 in different locations, respectively. Though internal electrodes are sequentially disposed in the order of reference numerals 105a, 106a, 107a, 108a, 109a, 110a, 111a, and 112a in the present embodiment, a disposition order of the internal electrodes is not limited thereto. For example, in a block, eight internal electrodes may be disposed in the order of reference numerals 105a, 108a, 107a, 110a, 109a, 112a, 111a, and 106a. To alternately dispose different polarity internal electrodes, the eight internal electrodes 105a to 112a may be disposed in various sequences.

Since the internal electrodes 105a, 107a, 109a, and 111a of the first polarity are connected to the external electrodes 105, 107, 109, and 111 in different locations from each other, via only one lead, the capacitor array 100 totally provides four multilayer capacitor devices. That is, a first multilayer capacitor device including the internal electrode 105a connected to the first polarity external electrode 105, a second multilayer capacitor device including the internal electrode 107a connected to the first polarity external electrode 107, a third multilayer capacitor device including the internal electrode 109a connected to the first polarity external electrode 109, a fourth multilayer capacitor device including the internal electrode 111a connected to the first polarity external electrode 111, are provided in a single chip, as mutually independent capacitor devices.

The capacitor array 100 may be used as totally four EMI filters or four decoupling capacitors by connecting first polarity external electrodes 105, 107, 109, and 111 of the respective multilayer capacitor devices to mutually different signal lines or a power source and connecting the second polarity external electrodes 106, 108, 110, and 112 to a ground. When two, three, or four of the first polarity external electrodes 105, 107, 109 and 111 are connected with each other, an identical number of the multilayer capacitor devices can be connected in parallel. Therefore, the capacitor array 100 can be connected to three, two, or one signal lines or the power source. Finally, the capacitor array 100 is connected to one to four signal lines or the power source line to be used as one to four EMI filters or decoupling capacitors.

As described above, the eight-terminal capacitor array 100 provides advantages such as preventing delamination, providing high capacitance, and providing a low ESL and ESR, and a crosstalk between capacitor devices.

In the embodiments, multilayer capacitor devices formed in a capacitor array may have approximately identical or similar capacitance since the area and the number of internal electrodes and the thickness and material of dielectric layers are considered to be mutually identical for each multilayer capacitor device. However, in some cases, it is required to provide capacitor devices having mutually different capacitances in a single chip. To satisfy the requirement, the number of internal electrodes connected to a first polarity internal electrode disposed in mutually different locations may be different from each other. FIGS. 5 and 6 illustrate examples of multilayer capacitors having mutually different capacitances, having different numbers of internal electrodes, and provided in a single chip.

In the case of four-terminal capacitor array 20 shown in FIG. 5A, the number of internal electrodes 25a of a first polarity such as (+) is different from the number of other internal electrodes 27a, disposed in a capacitor body 21. Particularly, the number of the internal electrodes 27a connected to a (+) external electrode 27 in a first location is greater than the number of the internal electrodes 25a connected to a (+) external electrode 25 in a second location.

Referring to FIGS. 5A and 5B, (+) external electrodes 25 and 27 and (−) external electrodes 26 and 28 are disposed on both side surfaces of the capacitor body 21, eight internal electrodes form one block in the capacitor body 21, and the block is repeatedly deposited. The block shown as a dot line in which the eight internal electrodes exist in FIG. 5B includes four types of internal electrodes 25a, 26a, 27a, 28a connected to external electrodes 25, 26, 27, and 28, respectively. The four types of the internal electrodes 25a to 28a are sequentially disposed in a deposition direction in the order of 25a, 26a, 27a, 28a, 27a, 26a, and 28a, in the block.

As shown in FIG. 5B, in one block, the number of the internal electrodes 27a connected to the (+) external electrode 27 in one location is greater than the number of the internal electrodes 25a connected to the (+) external electrode 25 in another location by two. Accordingly, via overall the capacitor body 21, the number of the (+) internal electrodes 27a is greater than the number of the (+) internal electrodes 25a. Finally, the capacitance of the first capacitor device formed by a plurality of (+) internal electrodes 27a and the (−) internal electrodes 26a and 28a is greater than that of the second capacitor device formed by a plurality of the (+) internal electrodes 25a and the (−) internal electrodes 26a and 28a since the first capacitor device formed by repeatedly depositing the internal electrodes 26a, 27a, and 28a has a greater number of internal electrodes than the second capacitor device formed by depositing the internal electrodes 28a, 25a, and 26a.

In the present embodiment, though internal electrodes are disposed in the block in the order of 25a, 26a, 27a, 28a, 27a, 26a, 27a, and 28a, the order is not limited thereto. The number of the internal electrodes 27a may be increased more than the number of the internal electrodes 25a by disposing the four types of the internal electrodes 25a to 28a in a different order. Also, in the block, the number of the internal electrodes 25a may be increased more than that of the internal electrodes 27a. In addition, the capacitance of the first capacitor device formed by repeatedly depositing the internal electrodes 26a, 27a, and 28a may be increased by increasing the number of the internal electrodes 27a disposed in the block. In this case, the number of internal electrodes disposed in one block increases.

Figure 6A:
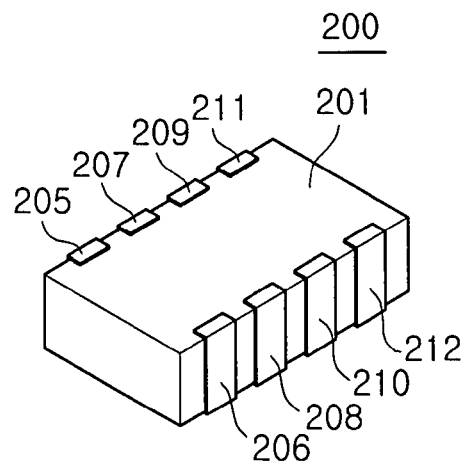
Figure 6B:
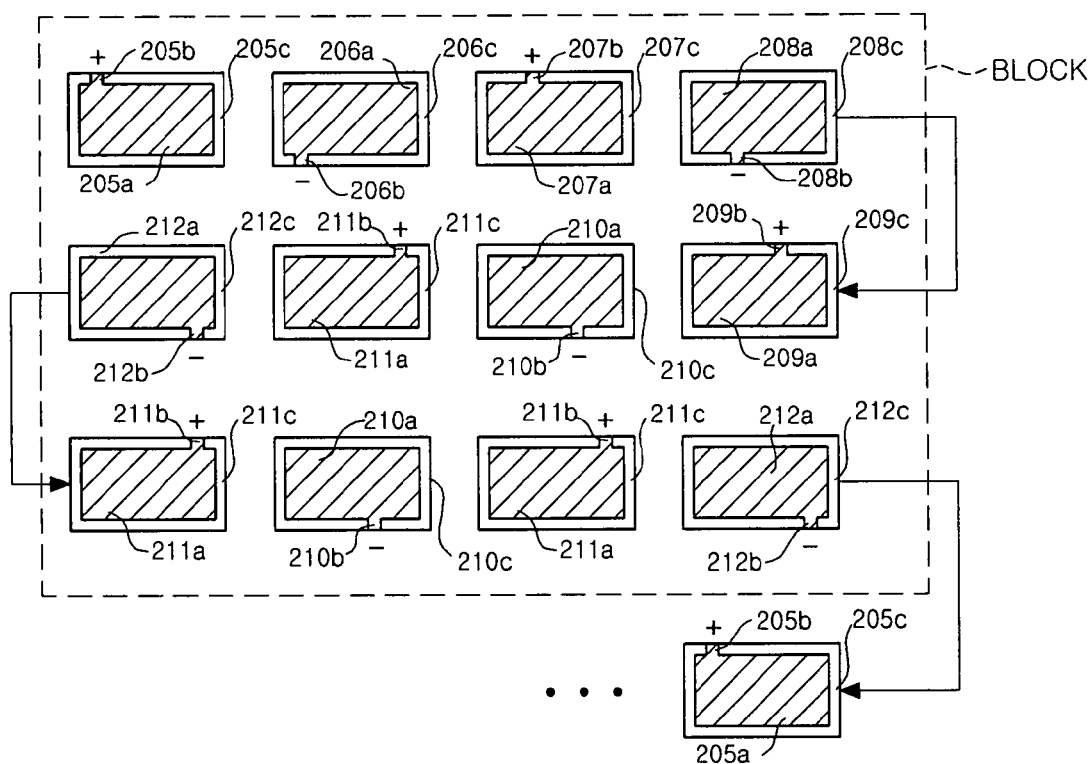

FIGS. 6A and 6B are views illustrating an example of an eight terminal capacitor array 200 providing capacitor devices having different capacitances. Referring to FIG. 6, first polarity external electrodes 205, 207, 209, and 211 and second polarity external electrodes 206, 208, 210, and 212 are disposed on both side surfaces of a capacitor body 201, twelve internal electrodes form one block in the capacitor body 201, and the block is repeatedly deposited. In the block, eight internal electrodes 205a to 212a connected to external electrodes 205 to 212, respectively, are sequentially disposed in the order of reference numerals 205a, 206a, 207a, 208a, 209a, 210a, 211a, 212a, 211a, 210a, 211a, and 212a.

As shown in FIGS. 6A and 6B, the number of the internal electrodes 211a connected to the first polarity external electrode 211 in a first location is greater than that of the internal electrodes 209a connected to another first polarity external electrode 209 in a second location different from the first location. Accordingly, a multilayer capacitor device having the internal electrodes 211a has a greater capacitance than that of a multilayer capacitor device having the internal electrodes 209a. A detailed disposition order of internal electrodes is not limited to that shown in FIG. 6B. The capacitance of a desired capacitor device may be controlled by varying a total number of internal electrodes in a block and a disposition method thereof.

An embodiment shown in FIGS. 7A and 7B provides a method of more effectively preventing a crosstalk between multilayer capacitor devices in one chip by adjusting a width and a length of an internal electrode.

A capacitor array 60 of FIGS. 7A and 7B is approximately identical to the capacitor array 10 of FIGS. 3A and 3B except that a width $W_2$ and a length $L_2$ of a main portion of second polarity (−) internal electrodes 66a and 68a are greater than that of a main portion of first polarity (+) internal electrodes 65a and 67a. In this case, the main portion of the internal electrode indicates a major portion of the internal electrode except for a lead and has a rectangular shape in FIG. 7B.

As described above, when the width and the length of the main portion of the (−) internal electrodes 66a and 68a are greater than that of the main portion of the (+) internal electrodes 65a and 67a, the two (+) internal electrodes 65a and 67a disposed adjacent to each other are definitely shielded by a ground electrode, that is, one of the (−) internal electrodes 66a and 68a therebetween. Accordingly, a crosstalk between multilayer capacitor devices in a single chip may be more prevented. Particularly, though a misalignment of internal electrodes occurs in a deposition direction during a procedure of manufacturing a capacitor array, a possibility in which (+) internal electrodes mutually adjacent are out of a ground electrode and partially overlap with each other becomes more decreased, thereby more effectively preventing a crosstalk between signal lines or power source lines, approximately regardless of the misalignment of the internal electrodes.

Figure 9A:
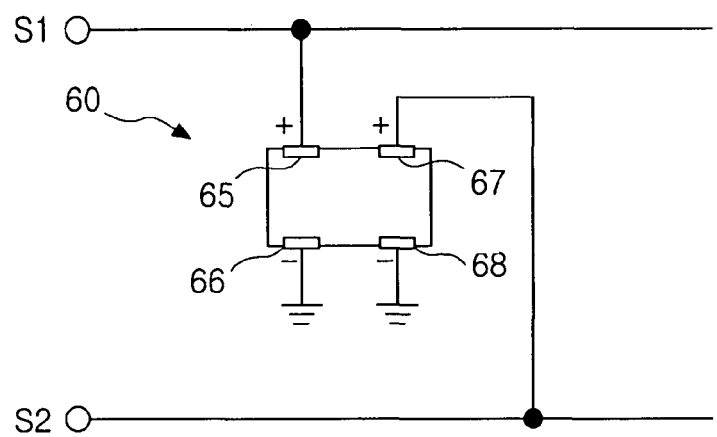
FIGS. 9A, 9B, and 9C are diagrams illustrating examples of a multilayer capacitor array and internal electrode structures according to another embodiment of the present invention.
Figure 9B:
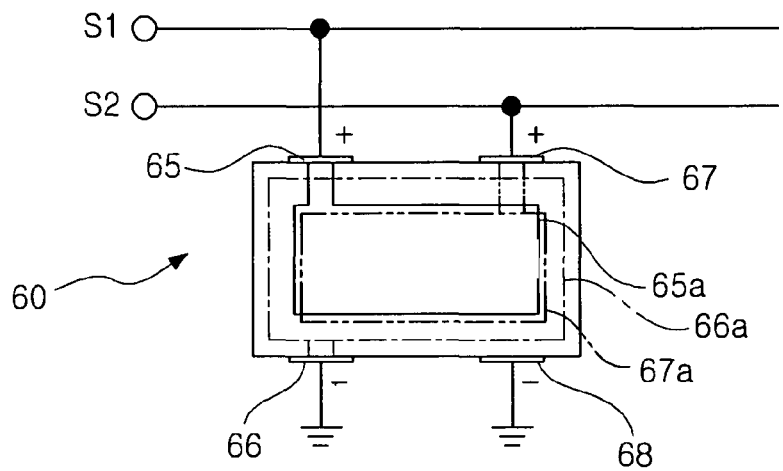
Figure 9C:
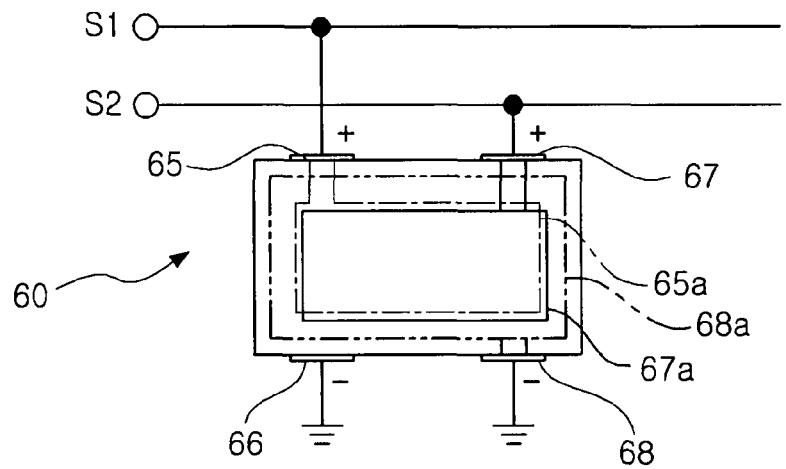

An effect of preventing a crosstalk due to the misalignment of internal electrodes will be described with reference to FIGS. 9A, 9B, and 9C. As shown in FIG. 9A, the capacitor array 60 may be connected to different signal lines S1 and S2 and be used as an EMI filter array. In this case, as shown in FIG. 9B, though the misalignment of a (+) internal electrodes 67a occurs, two adjacent (+) internal electrodes 65a and 67a are more definitely shielded by a (−) internal electrode 66a having greater width and length, thereby effectively preventing a crosstalk. Similarly, as shown in FIG. 9C, through the misalignment of the (+) internal electrodes 65a occurs, two adjacent (+) internal electrodes 67a and 65a are more definitely shielded by a (−) internal electrode 68a having greater width and length, thereby effectively preventing a crosstalk. When the capacitor array 60 is used as a decoupling capacitor array for different power circuit, an electromagnetic interference between power source lines may be reduced and the described crosstalk prevention effect may be obtained.

In the embodiment shown in FIGS. 7A and 7B, when changing and mounting the external electrodes 65 and 67 and the external electrodes 66 and 68 due to an error in a mounting process, that is, (−) voltage is applied to the external electrodes 65 and 67 and (+) voltage is applied to the external electrodes 66 and 68, since the width $W_1$ and the length $L_1$ of the main portion of the (−) internal electrodes 65a and 67a are smaller than that of the main portion of the (+) internal electrodes 66a and 68a, a possibility in which the two adjacent (+) internal electrodes 66a and 68a are out of the ground electrodes 65a and 67a and partially overlap with each other becomes greater than that of the capacitor array 10 in FIG. 3A. Accordingly, to easily distinguish the polarity of external electrodes, a mark 69 may be made on an external surface of the capacitor body 61. For example, the mark 69 having a particular shape such as a circle, particularly, defining the direction of a capacitor array, may be formed on one side end of a top surface of the capacitor body 61, thereby distinguishing the polarity of the external electrodes. In FIG. 7A, when locating the capacitor array 60 in such a way that the mark 69 is on the center, based on the center of the capacitor array 60, external electrodes formed on a left side surface of the mark 69 are designated as (+) external electrodes.

In FIG. 7B, though a width and length of a main portion of (−) internal electrodes are greater than that of a main portion of (+) internal electrodes, the present invention is not limited thereto. For example, the width $W_2$ and length $L_2$ of the main portion of the (−) internal electrodes 66a and 68a may be greater than that of the main portion of the (+) internal electrode 65a and be smaller than that of the main portion of the (+) internal electrode 67a. In this case, since the main portion of the (−) internal electrode 66a has a greater width and length than that of the main portion of the (+) internal electrode 65a adjacent thereto, a possibility of the occurrence of crosstalk due to the misalignment of internal electrodes may be prevented. Here, a mark for distinguishing a polarity may be formed on an external surface of a capacitor body to easily distinguish the polarity of external electrodes.

Figure 10:
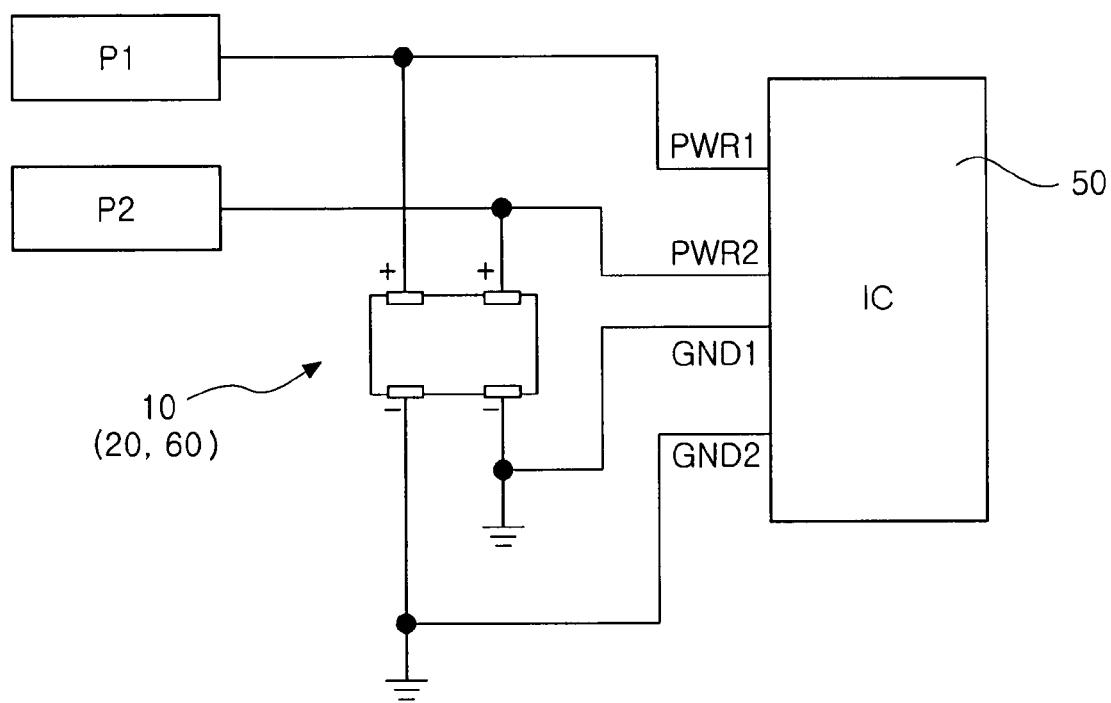
FIGS. 10 and 11 are diagrams illustrating various examples of a multilayer capacitor array according to an embodiment of the present invention.
Figure 11:
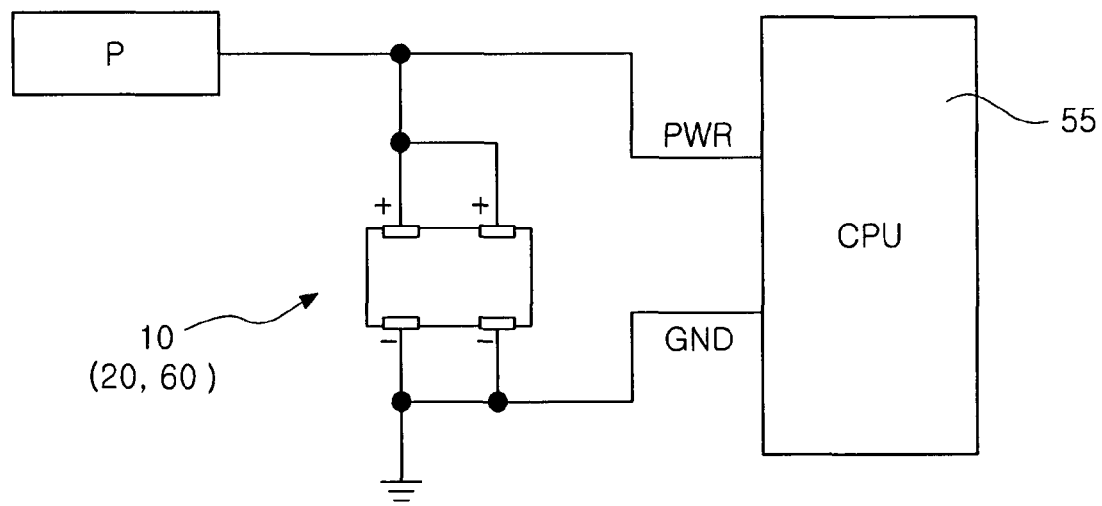

FIGS. 10 and 11 are diagrams illustrating various examples of a multilayer capacitor array according to an embodiment of the present invention.

Referring to FIG. 10, the capacitor array 10, 20, or 60 may be used as a decoupling capacitor of an IC power circuit having two or more power terminals such as an IC chip for communication. For example, (+) external electrodes of the capacitor array 10 are connected to power lines of different power sources P1 and P2, (−) external electrodes of the capacitor array 10 are connected to a ground, and multilayer capacitor devices in the capacitor array 10 are connected to respective power circuits in series. Reference numerals PWR1 and PWR2 indicate power terminals of and IC 50, and reference numerals GND1 and GND2 indicate ground terminals of the IC 50. Therefore, the capacitor array 10 may be used as a decoupling capacitor for two power circuits.

Referring to FIG. 11, the capacitor array 10, 20, or 60 is connected to a power circuit of a CPU 55 in parallel. All (+) external electrodes are mutually connected and all (−) external electrodes are mutually connected, thereby mutually connecting two capacitor devices in the capacitor array 10 in parallel. The (+) external electrodes of the two capacitor devices mutually connected in parallel are connected to a power line, that is, a line connecting a power terminal to a power source, and the (−) external electrodes are connected to a ground, thereby using the capacitor array 10 as a decoupling capacitor for one power circuit.

An eight-terminal capacitor array may be applied to the described decoupling capacitor for two or more power circuit or the EMI filter for two or more signal line. According to an exemplary embodiment of the present invention, since multilayer capacitor devices may be provided as the number of (+) external electrodes in a capacitor array, a capacitor array having a total N (N is an integer two or more) number of (+)

external electrodes may be used as a decoupling capacitor or EMI filter by being connected to from 1 to N number of power circuits or signal lines.

In the described embodiments, though four-terminal or eight-terminal capacitor array has been described, the present invention is not limited thereto. For example, the present invention may be applied to four or more-terminal capacitor array such as six-terminal or ten-terminal capacitor array.

According to the present invention, delamination is prevented, high capacitance is provided in the same area, low ESL and ESR characteristics are provided. Also, a crosstalk between multilayer capacitor devices in a capacitor array is small, and more particularly, though there is a misalignment of internal electrodes, crosstalk may be effectively prevented by controlling a width and length of (−) and (+) external electrodes. Also, a layout for a conductive path of a circuit board for mounting a capacitor array is easily formed.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer capacitor array having a plurality of multilayer capacitor devices formed in a single multilayer structure, the multilayer capacitor array comprising:
   a capacitor body formed by depositing a plurality of dielectric layers and having first and second side surfaces opposite to each other;
   a plurality of first polarity internal electrodes and second polarity internal electrodes, disposed oppositely to each other in the capacitor body, interposing the dielectric layer therebetween, and formed of a single electrode plate comprising a single lead, respectively; and
   a plurality of first polarity external electrodes and second polarity external electrodes, formed on the first side surface and second side surface, respectively, and connected to a correspondent polarity internal electrode via the lead, the first polarity external electrode formed on the first side surface and the second polarity external electrode formed on the second side surface,
   wherein four or more internal electrodes forming a single block are sequentially disposed in a deposition direction, and a plurality of the blocks are repeatedly deposited in the deposition direction,
   wherein the leads of the four or more internal electrodes forming the block do not overlap with each other in the deposition direction, and are connected to external electrodes in different locations, respectively, and
   wherein the numbers of the first polarity external electrodes and the second polarity external electrodes are two or more, respectively, and are identical to each other, a multilayer capacitor device consists of the two or more blocks and a total number of the multilayer capacitor devices in the multilayer capacitor array is identical to the number of the first polarity external electrodes.

2. The multilayer capacitor array of claim 1, wherein the multilayer capacitor devices formed in the multilayer capacitor array have a capacitance identical to each other.

3. The multilayer capacitor array of claim 1, wherein two or more multilayer capacitor devices of the multilayer capacitor devices formed in the multilayer capacitor array have a different capacitance.

4. The multilayer capacitor array of claim 3, wherein the number of internal electrodes connected to the first polarity external electrode in a first location is different from the number of internal electrodes connected to the first polarity external electrode in a second location.

5. The multilayer capacitor array of claim 1, wherein the multilayer capacitor array is a four-terminal capacitor, and
   first and third external electrodes of a first polarity are disposed on the first side surface, and second and fourth external electrodes of a second polarity are disposed on the second side surface to be opposite to the first and third external electrodes.

6. The multilayer capacitor array of claim 5, wherein four internal electrodes sequentially disposed in a deposition direction form a single block, and the block is repeatedly deposited, and
   leads of the four internal electrodes forming block are drawn to positions without overlapping each other in the deposition direction and connected to external electrodes in different locations, respectively.

7. The multilayer capacitor array of claim 6, wherein the block comprises first to fourth internal electrodes connected to the first to fourth external electrodes via the leads, respectively, and
   the first, second, third, and fourth internal electrodes are sequentially disposed in the block.

8. The multilayer capacitor array of claim 5, wherein eight internal electrodes sequentially disposed in a deposition direction form a single block and the single block is repeatedly deposited,
   the block comprises first to fourth internal electrodes connected to the first to fourth external electrodes via the leads, respectively, and
   the first to fourth internal electrodes are consecutively disposed in the block in order of first, second, third, fourth, third, second, third, and fourth internal electrodes.

9. The multilayer capacitor array of claim 1, wherein the multilayer capacitor array is an eight-terminal capacitor, and
   first, third, fifth, and seventh external electrodes of a first polarity are disposed on the first side surface, and second, fourth, sixth, and eighth external electrodes of a second polarity are disposed on the second side surface to be opposite to the first, third, fifth, and seventh external electrodes, respectively.

10. The multilayer capacitor array of claim 9, wherein eight internal electrodes sequentially disposed in a deposition direction form a single block, and the block is repeatedly deposited, and
    leads of the eight internal electrodes forming block are drawn to positions without overlapping each other in the deposition direction and connected to external electrodes in different locations, respectively.

11. The multilayer capacitor array of claim 10, wherein the block comprises first to fourth internal electrodes connected to the first to eighth external electrodes via the leads, respectively, and
    the first, second, third, fourth, fifth, sixth, seventh, and eighth internal electrodes are sequentially disposed in the block.

12. The multilayer capacitor array of claim 9, wherein twelve internal electrodes sequentially disposed in a deposition direction form a single block and the single block is repeatedly deposited,
    the block comprises first to eighth internal electrodes connected to the first to eighth external electrodes via the leads, respectively, and
    the first to eighth internal electrodes are consecutively disposed in the block in order of first, second, third, fourth, fifth, sixth, seventh, eighth, seventh, sixth, seventh, and eighth internal electrodes.

13. The multilayer capacitor array of claim 1, wherein a width and a length of a main portion of the second polarity internal electrode are larger than those of a main portion of the first polarity internal electrode.

14. The multilayer capacitor array of claim 13, wherein a mark for distinguishing a polarity of an external electrode is on an external surface of the capacitor body.

15. The multilayer capacitor array of claim 1, wherein the main portions of the respective second polarity internal electrodes have larger width and length than one or more of the main portions of the first polarity internal electrodes adjacently disposed thereto.

16. The multilayer capacitor array of claim 1, wherein one or more of the first polarity external electrodes are connected to one of different signal lines whose number is a total number of the first polarity external electrodes and a power source line, and the second polarity external electrode is connected to a ground.

17. The multilayer capacitor array of claim 1, wherein the four or more internal electrodes forming a single block do not have any internal electrode overlapping with the four or more internal electrodes between or adjacent the four or more internal electrodes.

* * * * *